United States Patent [19]

Takabayashi et al.

[11] Patent Number: 5,130,192
[45] Date of Patent: Jul. 14, 1992

[54] PROCESS FOR PREPARING METALLIZED POLYIMIDE FILM

[75] Inventors: Seiichirou Takabayashi, Hirakata; Kazuaki Mii; Kenichiro Yano, both of Ube, all of Japan

[73] Assignee: Ube Industries, Ltd., Yamaguchi, Japan

[21] Appl. No.: 613,062

[22] Filed: Nov. 15, 1990

[30] Foreign Application Priority Data

Nov. 17, 1989 [JP] Japan .................................. 1-297430

[51] Int. Cl.$^5$ .............................................. B32B 15/08
[52] U.S. Cl. ........................................ 428/332; 427/209; 427/250; 427/304; 427/306; 427/316; 427/383.1; 427/404; 427/443.1; 428/458
[58] Field of Search ............... 204/192.15; 427/96, 427/98, 99, 250, 304, 306, 443.1, 209, 316, 383.1, 404; 428/409, 473.5, 901, 332, 458

[56] References Cited

U.S. PATENT DOCUMENTS

| | | | |
|---|---|---|---|
| 4,405,678 | 9/1983 | Downing et al. | 427/255.1 |
| 4,710,403 | 12/1987 | Krause et al. | 427/304 |
| 4,775,556 | 10/1988 | Krause et al. | 427/306 X |
| 4,959,121 | 9/1990 | Dumas et al. | 427/307 X |
| 4,975,327 | 12/1990 | Somasiri et al. | 427/306 X |

FOREIGN PATENT DOCUMENTS 54-141391 11/1979 Japan .
55-7805 1/1980 Japan .
60-42817 9/1985 Japan .

*Primary Examiner*—Michael Lusignan
*Attorney, Agent, or Firm*—Finnegan, Henderson, Farabow, Garrett & Dunner

[57] ABSTRACT

A process for preparing a metallized polyimide film, comprising the steps of: forming a solidified film containing 100 parts by weight of an aromatic polyamic acid in the form of a solution obtained by polymerizing approximately equal moles of an aromatic tetracarboxylic acid component and an aromatic diamine component and 5 to 150 parts by weight of an organic polar solvent; applying a surface treatment solution containing a heat-resistant surface treating agent to the surface of the solidified film; heating the solidified film to a high temperature to imidize the polyamic acid, while drying the film to prepare a polyimide film; forming a thin metal vapor-deposited layer by a vapor deposition of a metal on the treated surface of the polyimide film with the heat-resistant surface treatment agent; and applying metal plating onto the metal vapor deposited layer to form a metal plated layer thereon.

17 Claims, 1 Drawing Sheet

PROCESS FOR PREPARING METALLIZED POLYIMIDE FILM

BACKGROUND OF THE INVENTION

1. Field of the Invention

The present invention relates to a process for preparing a metallized polyimide film. More specifically, it relates to a process for preparing a metallized polyimide film comprising an aromatic polyimide layer and a metal plated layer bonded integrally with a high bonding strength or high adhesion through a metal vapor deposited layer, without the use of an adhesive, and the laminated film obtained therefrom. The metallized polyimide films thus prepared can be practically utilized for various purposes, such as a magnetic tape, TAB, and flexible printed circuit substrate.

2. Description of the Related Art

In the prior art, a metallizing film obtained by a conventional metallizing technique for forming a metal layer on an organic film has been generally used for, for example, gold and silver coatings providing a decorative metallic luster and packaging material utilizing a gas barrier characteristic.

Recently, the usage of metallized films has expanded, by utilizing the electrical characteristics possessed by a metal vapor deposited film, for example, when used as a base material of electronic units such as printed circuit substrate.

Known metallized films as mentioned above are generally prepared by a vapor deposition of various metals onto organic films by, for example, the vapor deposition method, or the sputtering method, or the ion plating method, (for example, see Japanese Unexamined Patent Publication (Kokai) No. 54-141391).

Further, a method of preparing an aromatic polyimide film having a high heat resistance from an aromatic polymer composition comprising an aromatic polyamic acid obtained from an aromatic tetracarboxylic acid component such as biphenyltetracarboxylic acids and an aromatic diamine component, such as phenylenediamine, dissolved in an organic polar solvent by the solution casting method, is known from, for example, Japanese Patent Publication (Kokoku) No. 60-42817.

Nevertheless, although the biphenyltetracarboxylic acid type polyimide film prepared according to the above-mentioned known method has a high heat resistance, mechanical strength and dimensional stability, the polyimide film has a poor bonding strength to a metal vapor deposited layer or a metal plated layer, and therefore, the metallized polyimide film prepared by a metal vapor deposition and a metal plating directly onto the above-mentioned polyimide film is not practical from the viewpoint of the bonding strength between the polyimide layer and the metal layer, and accordingly, these metallized polyimide films are not practically used as materials for electronic parts (e.g, printed circuit substrate) requiring a high reliability.

To improve the adhesion strength between the aromatic polyimide film and the metal layer, as described above, attempts have been made to roughen the surface of the film, or to introduce reactive functional groups by an electrophysical surface treatment of the surface of an aromatic polyimide film by a corona treatment or plasma treatment, or by a chemical surface treatment.

Nevertheless, even when using the known means as mentioned above, it is extremely difficult to sufficiently enhance the adhesion between an aromatic polyimide film and a metal layer, such as metal vapor deposited layer, to a practical extent.

SUMMARY OF THE INVENTION

Accordingly, the objects of the present invention are to eliminate the above-mentioned disadvantages of the prior art and to provide a process for preparing a metallized polyimide film having a high adhesion strength between an aromatic polyimide film and a metal layer, such as a metal vapor deposited layer.

Other objects and advantages of the present invention will be apparent from the following description.

In accordance with the present invention, there is provided a process for preparing a metallized polyimide film, comprising the steps of:

forming a solidified film containing 100 parts by weight of an aromatic polyamic acid in the form of a solution obtained by polymerizing approximately equal moles of an aromatic tetracarboxylic acid component and an aromatic diamine component and 5 to 150 parts by weight of an organic polar solvent;

applying a surface treatment solution containing a heat-resistant surface treating agent to the surface of the solidified film;

heating the solidified film to a high temperature to imidize the polyamic acid, while drying the film to prepare a polyimide film;

forming a thin metal vapor deposited layer by a vapor deposition of a metal on the surface of the polyimide film treated with the heat-resistant surface treatment agent; and applying a metal plating onto the metal vapor deposited layer to form a metal plated layer thereon.

In accordance with the present invention, there is also provided a process for preparing a metallized polyimide film, comprising the steps of:

forming a coating layer or a vapor deposited layer of an inorganic substance on one surface of an aromatic polyimide film;

vapor depositing a metal directly onto the other surface of the film, to form a thin metal deposited layer; and applying a metal plating to the metal vapor deposited layer to thereby form a metal plated layer.

BRIEF DESCRIPTION OF THE DRAWINGS

The present invention will be better understood from the description set forth below with reference to the accompanying drawings, in which.

DESCRIPTION OF THE PREFERRED EMBODIMENT

Figure 1:
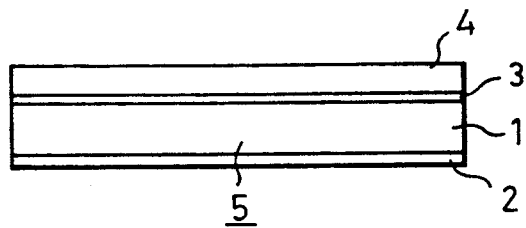
FIG. 1 is a sectional view showing a partial cross-section of a metallized film of the present invention.

In the first embodiment of the present invention, the present inventors made an intensive study of the method of preparing a metallized polyimide film having an improved bonding strength between the polyimide film layer and a metal vapor deposited layer or a metal plated layer when metal vapor deposited metal plating is applied to an aromatic polyimide film. As a result, we found that a metallized polyimide film having excellent performances can be prepared by treating the surface of a solidified film containing a solvent (solvent containing aromatic polyimide precursor film) with a specific surface treating solution, to form a polyimide film treated product, and effecting a metal vapor deposition of a metal onto the surface of the polyimide film treated with the surface treating solution, and further, effecting a metal plating on the metal vapor deposited layer, to thereby accomplish the present invention. The solidified film is prepared from an aromatic polymer composition (solution composition) containing an aromatic polyamic acid (aromatic polyimide precursor) dissolved in an organic polar solvent by, for example, the solution casting method.

In the second embodiment of the present invention, the present inventors found that a metallized film having an inorganic substance layer (coating layer or vapor deposited layer) on one surface of an aromatic polyimide film, and a metal vapor deposited layer and a metal plated layer formed in this order on the other surface of the film can be produced, and further, that a process for preparing the above-mentioned metallized film having a strong adhesion with a good reproducibility by a coating or a vapor deposition of an inorganic substance on one surface of an aromatic polyimide film, subsequently vapor depositing a thin metal layer on the other surface of said film, and then applying a metal plating to the metal vapor deposited layer, can accomplish the object of the present invention.

Examples of the above-mentioned aromatic tetracarboxylic acid component preferably include aromatic tetracarboxylic acid components containing 60 mole % or more, particularly 70 mole % or more of biphenyltetracarboxylic acids such as 2,3,3',4'-biphenyltetracarboxylic acid or acid dianhydride thereof, or esterified products of the acid with lower alcohols having 1 to 5 carbon atoms, 3,3',4,4'-biphenyltetracarboxylic acid or acid dianhydride thereof, or esterified products of the acid with lower alcohols having 1 to 5 carbon atoms, based on the total tetracarboxylic acid components.

In the present invention, as the tetracarboxylic acid component, an aromatic tetracarboxylic acid component containing 60 mole % or more, more preferably 70% or more, of 3,3'4,4'-biphenyltetracarboxylic acid or an acid dianhydride thereof is most preferable with respect to the heat resistance and mechanical properties of the finally-obtained polyimide film.

In the above-mentioned aromatic tetracarboxylic acid component, as the tetracarboxylic acids which can be used in combination in addition to the above-mentioned biphenyltetracarboxylic acids, there are included aromatic tetracarboxylic acids such as pyromellitic acid or an acid dianhydride thereof, benzophenonetetracarboxylic acid or an acid dianhydride thereof, diphenylethertetracarboxylic acid or an acid dianhydride thereof, bis(3,4-dicarboxyphen-yl)methane or an acid dianhydride thereof, and 2,2-bis(3,4-dicarboxy-phenyl)propane or an acid dianhydride thereof, bis(3,4-dicarboxyphenyl)sulfonic acid or an acid dihydride thereof, or mixtures thereof.

The above-mentioned aromatic diamine component is preferably, for example, an aromatic diamine component containing 50 mole % or more, preferably 60 mole % or more, more preferably 70 mole % or more, most preferably 80 to 100 mole % of phenylenediamines such as m- or p-phenylenediamine, 3,5-diaminotoluene, 2,5-diaminotoluene.

In the present invention, as the above-mentioned aromatic diamine component, an aromatic diamine component containing preferably 60 mole % or more, more preferably 70 mole % or more, most preferably 70 to 100 mole % of p-phenylenediamine is most preferable.

In the above-mentioned aromatic diamine component, as the aromatic diamines which can be used in combination in addition to the phenylenediamines, there are included diaminodiphenyl ethers such as 4,4'-diamino-diphenyl ether, 3,4'-diaminodiphenyl ether, 3,3'-diaminodiphenyl ether, etc.; 4,4'-diaminodiphenylmethane, 4,4'-diaminodiphenylpropane, 4,4'-diaminodiphenylsulfone, and 4,4'-diaminodiphenylsulfide. In the present invention, diaminodiphenyl ethers such as 4,4'-diaminodiphenyl ether are particularly preferred.

In the present invention, when the content of phenylenediamines in the aromatic diamine component for preparation of the aromatic polyamic acid as described above is too low, even when using an aromatic polyamic acid composition obtained from such aromatic diamine component and aromatic tetracarboxylic acid, the polyimide film may be sometimes have a lower heat resistance or one of the mechanical properties mentioned above.

The above-mentioned polyamic acid is preferably a polymer:

(a) which is a biphenyltetracarbox-ylic acid type polyimide precursor obtained by a polymerization of an aromatic tetracarboxylic acid component and an aromatic diamine component at a low temperature, as described above, (b) has a logarithmic viscosity (measurement temperature: 30° C., concentration: 0.5 g/100 ml solvent, solvent: N-methyl-2-pyrrolidone) of about 0.1 to 7, most preferably 0.2 to 5, (c) having an imidation degree [imidation degree determined by the IR-spectral analytical method (IR method)] smaller than 85%, preferably 70% or lower, and further, (d) which can be uniformly dissolved in an organic polar solvent to about 50% by weight.

The above-mentioned logarithmic viscosity is a value calculated by the following formula:

$$\text{Logarithmic viscosity} = \frac{\text{Natural logarithmic (solution viscosity/solvent viscosity)}}{\text{Concentration of solution}}$$

In the IR-spectral analytical method of determining the above-mentioned imidization degree, the imidization degree can be determined from the ratio of the absorbance at the absorption peak 1720 cm$^{-1}$ based on the imide bond of the IR-spectral absorption spectrum of the sample to the absorbance at the absorption peak 1660 cm$^{-1}$ based on the amide acid bond.

The above-mentioned organic polar solvent may be an organic polar solvent which can uniformly dissolve the aromatic polyamic acid as described at a polymer solution of about 2 to 50% by weight, particularly 5 to 40% by weight, as preferably exemplified by organic solvents including N,N-di-(lower alkyl)carbosylamides such as N,N-dimethylformamide, N,N-diethylformamide, N,N-dimethylacetamide, N,N-diethylacetamide, N,N-dimethylmethoxyacetamide, N-methyl-2-pyrrolidone, dimethyl sulfoxide, diethyl sulfoxide, dimethylsulfone, diethylsulfone, and hexamethylsulforamide.

The solidified film in the preparation process of the present invention is preferably a flexible and self-supporting solidified film comprising an aromatic polyamic acid composition containing primarily (preferably 90% by weight of the content of both components) 100 part as by weight of an aromatic polyamic acid as described above and 5 to 150 parts by weight (preferably 10 to 120 parts by weight, particularly 20 to 100 parts by weight) of an organic solvent, most preferably, a lengthy solidified film prepared continuously by the solution casting method.

The solidified film may be a self-supporting solidified film having the above-mentioned composition formed by, for example, a film fabrication method such as a solution casting method, in which an aromatic polyamic acid solution containing a high molecular weight aromatic polyamic acid (aromatic polyimide precursor) obtained by polymerization of an aromatic tetracarboxylic acid component and an aromatic diamine component as described above in an organic polar solvent at a low temperature of about 100° C. or less, particularly preferably a temperature of 0 to 80° C., for about 0.1 and 10 hours, is used as the dope for a film fabrication, a liquid thin film (thin film of the above dope) is formed on a support surface at a casting temperature of 150° C. or less, particularly about 20 to 130° C., and the thin film is dried on the support at a drying temperature of about 120° C. or less, particularly about 20 to 100° C. for about 0.1 to 1 hour.

In the above-mentioned solidified film, if necessary, fine particulate fillers may be also formulated in a small amount, internally or in the surface layer.

In the preparation process of the present invention, it is preferable to prepare an aromatic polyimide film treated on at least one surface with a heat-resistant surface treating agent by, for example, applying a surface treating solution containing a heat-resistant surface treating agent at a concentration of 0.5% by weight or more and containing 20% by weight or less of water to at least one surface of the above-described solidified film (both surfaces, if necessary) by a coating method such as the gravure coating method, the screening method or the dipping method, and heating the solidified film coated with the surface treating solution at an appropriate high temperature (preferably 100 to 600° C., more preferably 120 to 550° C., most preferably 150 to 500° C.), preferably for 0.1 to 10 hours, more preferably 0.2 to 5 hours, to thereby imidize the polyamic acid forming the film to an imidization degree of 90% or more, preferably in such a manner that substantially no amide-acid bond exists, and simultaneously, removing the volatile components of the above-mentioned solvent from the film by an evaporation caused by drying same.

As the above-mentioned heat-resistant surface treating agent, the aminosilane type, epoxysilane type or titanate type heat-resistant surface treating agents having a decomposition temperature of 275° C. or more, preferably 280 to 600° C., particularly 290 to 550° C. are preferably included. For example, there can be included epoxysilane type heat-resistant surface treating agents (coupling agent) such as β-(3,4-epoxycyclohexyl)-ethyl-trimethoxysilane, 7-glycylidoxypropyl-trimethoxysilane; aminosilane type heat-resistant surface treating agents (coupling agents) such as γ-aminopropyl-triethoxysilane, N-β-(aminoethyl)-γ-aminopropyl-triethoxysilane, N-(aminocarbonyl)-γ-aminopropyl-triethoxysilane, N-[β-(phenylamino)-ethyl]-γ-aminopropyl-triethoxysilane, N-phenyl-γ-aminopropyl-triethoxysilane, N-phenyl-γ-aminopropyltrimethoxysilane; and titanate type heat-resistant surface treating agents (coupling agents) such as isopropyl-tricumylphenyltitanate, dicumylphenyl-oxyacetate-titanate. In the present invention, among the heat-resistant surface treating agents mentioned above, N-phenyl-γ-aminopropyltrimethoxysilane is most preferred.

The above-mentioned surface treating solution contains the heat-resistant surface treating agent as described above at a concentration of 0.5% by weight or more, preferably 1 to 100% by weight, more preferably 3 to 60% by weight, most preferably 5 to 55% by weight, and contains 20% by weight or less, preferably 10% by weight or less, more preferably 5% by weight or less of water, and further, a liquid surface treating agent which most preferably has a rotatory viscosity (solution viscosity measured by a rotatory viscometer at a measurement temperature of 25° C.) of 10 to 50000 centipoise.

In the present invention, preferably a surface treating solution with a low viscosity (particularly a rotatory viscosity of 10 to 5000 centipoise) containing the above-mentioned heat resistant surface treating agent at a concentration of 0.5% by weight, more preferably 1 to 60% by weight, most preferably 3 to 55% by weight, uniformly dissolved in an organic polar solvent such as a lower alcohol or amide type solvent is preferable, and as the organic solvent to be used for the above-mentioned surface treating solution, the polymerization solvent to be used for the preparation of the aromatic polyamic acid as described above, or the same kind of the organic polar solvent as the solvent contained in the solidified film to be used in the present invention, can be used. Also, a lower alcohol solvent having 1 to 5 carbon atoms, such as ethyl alcohol, methyl alcohol, propyl alcohol, butyl alcohol and the like, and further, a solvent mixture containing two or more kinds of those solvents, can be used.

In the above-mentioned heating treatment, preferably the imidation of the polymer and evaporation and removal of the solvent at a temperature of about 100 to 400° C. for preferably about 0.1 to 5 hours, more preferably 0.2 to 3 hours, are first effected. In particular, the above-mentioned heating treatment at about 100 to 400° C. is preferably carried out in steps, for example, at a low temperature of 100 to 170° C. for about 1 to 30 minutes as the first step, at a temperature of 170 to 220° C. for about 1 to 30 minutes as the second step, and at a high temperature of 220 to 400° C. for about 1 to 30 minutes as the third step.

In the present invention, if necessary, a high temperature heating treatment may be performed as the fourth step, at a high temperature of 400 to 600° C., and in a continuous heating treatment of 250° or more, it is preferable to prepare an aromatic polyimide film subjected to the surface treatment with a heat-resistant treating agent with both ends in the direction perpendicular to the length of the lengthy solidified film being fixed by pin tenters, crimps, or a frame.

In the preparation process of the metallized polyimide film of the present invention, after a metal such as noble metal (e.g., gold, silver), alkaline earth metal (e.g., magnesium, zinc), or transition metal (e.g., copper, cobalt, nickel, chromium, titanium) is vapor deposited by a physiochemical vapor deposition method such as the vacuum vapor deposition method or the sputtering method, on the treated surface of the aromatic polyimide film treated with a heat-resistant treating agent prepared as described above, to form a thin metal vapor deposited layer, the metal vapor deposited layer is applied to the metal plating by the chemical plating method or the electroplating method, to thereby form a thick metal plated layer and thus obtain a metallized polyimide film.

In the above-mentioned vacuum vapor deposition method, as the heating source for the vaporization of the metal or metal oxide, there may be included a resistant filament, a high frequency induction, an electron beam, or a laser beam heater process.

In the above-mentioned vacuum vapor deposition method, preferably the vacuum degree is about $10^{-2}$ to $10^{-7}$ Torr, the vapor deposition speed is about 50 to 5000 Å/sec., deposited substrate is about 200 to 600° C.

Among the above-mentioned sputtering methods, the RF magnet sputtering method is particularly preferable, and preferably the vacuum degree during that method is 1 Torr or less, more preferably about $10^{-3}$ to $10^{-2}$ Torr, the temperature of the substrate (polyimide film) is 200 to 450° C., and the formation speed of the vapor deposited layer is about 0.5 to 500 ÅA/sec.

As the metal plating method mentioned above, for example, an electroplating method may be employed in which a film article to be plated is dipped as the cathode into a solution containing metal ions, an anode is dipped opposite thereto and a direct current is passed therebetween, to thereby form a metal coated layer by precipitation, or a chemical plating method may be used in which metal ions in a metal salt solution are precipitated by a substitution reaction or redox reaction to form a metal coated layer.

As the metal plating conditions, for example, in the case of electroplating, the bath composition of the acidic bath preferably comprises 50 to 200 g/liter (particularly 50 to 100 g/liter) of copper sulfate, 100 to 300 g/liter (particularly 150 to 250 g/liter) of sulfuric acid and a small amount of a luster agent, and the plating operational conditions are preferably a temperature of 20 to 30° C., a cathode current density of 2 to 8 A/dm$^2$, air stirring, a cathode efficiency of 95 to 100%, an anode/cathode area ratio of 1:1, a cathode of rolled copper, a constant filtration, and a voltage of 6 V or less.

The vapor-deposited metal layer to be provided on the treated surface of the above-mentioned aromatic polyimide film is preferably a homogeneous layer having a thickness of about 50 to 50000 ÅA, more preferably about 500 to 20000 ÅA.

In the above-mentioned metallized polyimide film, the thin metal vapor deposited layer formed on the treated surface side of the above-mentioned aromatic polyimide film may be a thin layer formed by a physicochemical method such as the vacuum vapor deposition method or the sputtering method, using a vapor-depositable metal, for example, a noble metal such as gold and silver, platinum, an alkaline earth metal such as zinc, or a transition metal such as copper, cobalt, nickel.

Further, in the above-mentioned metallized polyimide film, the metal plated layer provided directly on the thin metal layer vapor-deposited on the treated surface side of the above-mentioned polyimide film may be, for example, a layer comprising a metal such as copper, nickel, chromium, zinc, cadmium, tin, lead, gold, silver, cobalt, antimony, bismuth, arsenic, and a thick layer formed by a plating method, such as the chemical plating method or electroplating method, and having a thickness of preferably about 1 to 100 μm, more preferably about 2 to 50 μm.

The second embodiment of the present invention is now described in detail with reference to the drawings.

FIG. 1 is a sectional view showing a partial cross-section of a metallized film of the present invention, and FIG. 2 is a flow chart showing the preparation process of the present invention.

The metallized film according to the second embodiment of the present invention, as shown in FIG. 1, comprises an aromatic polyimide film 1, a coating layer or vapor deposited layer 2 of an inorganic substance on one surface (back side) of the film, a metal vapor deposited layer 3 on the other surface (front side) of the film, and a metal plated layer 4 on the metal vapor deposited layer 3.

As the above-mentioned aromatic polyimide film 1, the above-mentioned film made of the heat-resistant aromatic polyimide obtained by a polymerization of the aromatic tetracarboxylic acid component and the aromatic diamine component, followed by imidation, is preferably used.

The above-mentioned aromatic polyimide film 1 preferably has a thickness of about 5 to 200 μm, more preferably 10 to 150 μm, and a secondary transition temperature of the film of from about 250° C. to 400° C., or having substantially no secondary transition temperature, but having a high heat resistance at a heat decomposition initiation temperature of the film of from 350 to 500° C., and further, a linear expansion coefficient (at a temperature of from 0 to 300° C.) of about $0.5 \times 10^{-5}$ to $3.0 \times 10^{-5}$ cm/cm/°C.

In the metallized film of the present invention, as the inorganic substance which forms the homogeneous coating layer or vapor deposited layer of the inorganic substance 2 provided on one surface (back side) of the above-described aromatic polyimide film, there may be included metal oxides such as $Al_2O_3$, $SnO_2$, $ZnO$, $SiO_2$, ITO, $TiO_2$, $In_2O_3$, $ZrO$, $MgO$, and $BeO$; inorganic coating materials such as titanate type polymers, silicone type or silicon type polymers, and zirconia type polymers; or vapor depositable metals including noble metals such as gold and silver; platinum; alkaline earth metals such as zinc; and transition metals such as copper, cobalt, and nickel. Particularly, in the metallized film of the present invention, metal oxides such as a silicon oxide, are most preferable as the inorganic substance.

The vapor deposited layer 2 provided on one surface (back side) of the above-described aromatic polyimide film is preferably a homogeneous layer having a thickness of about 50 to 50000 ÅA, more preferably about 500 to 20000 ÅA, and the thickness of the coating layer 2 provided on one surface (back side) of the above film is preferably about 0.01 to 50 μm, more preferably about 0.1 to 20 μm.

In the above-mentioned metallized film, the "thin metal vapor deposited layer 3" formed on the front side of the above-mentioned aromatic polyimide film 1 may be a thin layer formed of, for example, vapor-depositable metals including noble metals such as gold and silver; platinum; alkaline earth metals such as zinc; and transition metals such as copper, cobalt, nickel; as for the vapor deposited layer formed on the back side, as described above, which may be formed by a physicochemical method such as the vacuum vapor deposition method or the sputtering method. The thickness of the thin metal vapor deposited layer 3 is preferably about 100 to 50000 ÅA, more preferably about 500 to 20000 ÅA.

Further, in the above-mentioned metallized film, the metal plated layer 4 provided directly on the thin metal vapor deposited layer 3 on the front side of the above-mentioned aromatic polyimide film 1 comprises a metal such as copper, nickel, chromium, zinc, cadmium, tin, lead, gold, silver, cobalt, antimony, bismuth, or arsenic, and is a thick layer formed by the chemical plating method or the electroplating method, and having a thickness of preferably about 1 to 100 μm, more preferably about 2 to 50 μm.

Figure 2A:
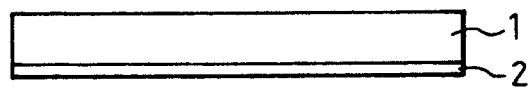
FIG. 2(A), 2(B), and 2(C) are drawings schematically showing the preparation process of the second embodiment of the present invention.

In the preparation process of the metallized film of the present invention, as shown in FIG. 2(A), first, a coating layer 2 of an inorganic substance is formed on one surface (back side) of the above-mentioned aromatic polyimide film 1 by the coating method which comprises coating and drying a dispersion of an inorganic substance, or a vapor-deposited layer 2 of an inorganic substance is formed by a vapor deposition method such as the vacuum vapor deposition method or the sputtering method.

Figure 2B:
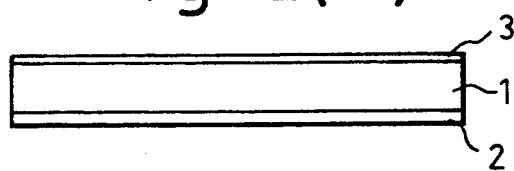
Figure 2C:
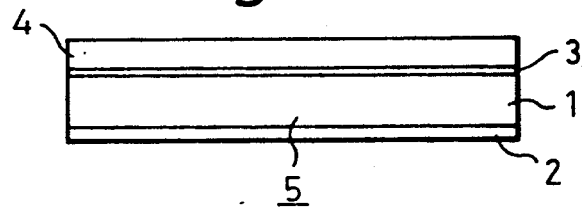

In the preparation process of the present invention, as shown in FIG. 2(B), on the other surface (front side) of the aromatic polyimide film 1 with the coating layer or on the vapor deposited layer of an inorganic substance formed on the back side as described above, a metal such as a noble metal, an alkaline earth metal or a transition metal is vapor-deposited by a physicochemical vapor deposition method such as the vacuum vapor deposition method or the sputtering method, to form a thin metal vapor deposited layer 3, followed by an application of a metal plating on the metal vapor deposited layer 3 by a chemical plating method or electroplating method, as shown in FIG. 2(C), to thereby form a thick metal plated layer 4, and thus obtain a metallized film 5.

In the above-mentioned vacuum vapor deposition method, as the source of heating the metals or metal oxides, there may be employed a resistant filament, a high frequency induction, an electron beam, or a laser beam heater.

In the above-mentioned vacuum vapor deposition method, the vacuum degree is preferably about $10^{-2}$ to $10^{-7}$ Torr, the vapor deposition speed is about 50 to 5000 Å/sec., and further, the temperature of the vacuum deposition substrate is about 200 to 600° C.

In the sputtering method as mentioned above, the RF magnet sputtering method is most preferable, and the vacuum degree in that case is preferably 1 Torr or less, more preferably about $10^{-3}$ to $10^{-2}$ Torr, the substrate temperature is 200 to 450° C., and the formation speed of the layer is about 0.5 to 500 Å/sec.

As the metal plating method described above, there may be employed a metal plating method such as the electroplating method in which an article to be plated is dipped as the cathode into a solution containing metal ions, an anode is dipped opposite thereto and a direct current is passed therebetween, to thereby form a metal coated layer by precipitation, or the chemical plating method in which a metal coated layer is formed by a precipitation from metal ions in a metal salt solution by a substitution reaction or redox reaction.

As the metal plating conditions, for example, in the case of electroplating, the bath composition of the acidic bath preferably comprises 200 to 300 g/liter of copper sulfate, 30 to 90 g/liter of sulfuric acid and a small of a luster agent, and as the plating operation conditions, the conditions of a temperature of 20 to 30° C., a cathode current density of 2 to 8 A/dm², air stirring, a cathode efficiency of 95 to 100%, an anode/cathode area ratio of 1:1, rolled copper for the cathode, a constant filtration, and a voltage of 6 V or less are preferable.

The metallized polyimide film obtained by the first embodiment of the present invention has a copper foil plated layer and a polyimide film layer bonded directly and integrally with a high bonding strength, without an adhesive layer, through a metal vapor deposited layer, and can be suitably used as a printed circuit substrate.

Furthermore, according to the second embodiment of the present invention, there is provided a metallized film having a vapor deposited layer of an inorganic substance on the back side of an aromatic polyimide film and a thin metal vapor-deposited layer and a thick metal-plated layer on the front side of the film; the metal plated layer being adhered to the aromatic polyimide film through the thin metal vapor-deposited layer with an extremely high adhesive strength. The preparation process of the present invention can prepare the above-mentioned metallized film industrially and with a good reproducibility. Therefore, according to the process of the present invention, by first vapor-depositing an inorganic substance on one surface of an aromatic polyimide film, the adherence between the metal plating layer and the polyimide film is improved.

EXAMPLES

The present invention will now be further illustrated by, but is by no means limited to, the following Examples.

EXAMPLE 1

On the surface of a flexible and lengthy solidified film (width: 1100 mm) having a thickness of 40 μm comprising 100 parts by weight of an aromatic polyamic acid obtained from 3,3',4,4'-biphenyltetracarboxylic acid dianhydride and p-phenylenediamine and 40 parts by weight of N,N-dimethylacetamide, was coated an N,N-dimethylacetamide solution containing N-phenyl-γ-aminopropyltrimethoxysilane dissolved therein (i.e., a surface treating solution), and the solidified film coated with the surface treating solution was heated first at 150° C. for 5 minutes, then at 200° C. for 7 minutes, further at 250° C. for 9 minutes, and finally, at 450° C. for 7 minutes, to effect an imidation of the polymer and to dry the film, to thereby prepare an aromatic polyimide film having a thickness of 25 μm (polyimide film treated with heat-resistant treating agent).

A vapor-deposited layer of copper having a thickness of 5000 Å was formed directly on the treated entire surface of the aromatic polyimide film by the vacuum vapor-deposition method using a high frequency induction heating means.

The vapor deposition as mentioned above was conducted under the conditions of a vacuum degree of about $10^{-4}$ to $10^{-3}$ Torr, a vapor deposition speed of 200 Å/sec, and further, for a time until the thickness of the vapor deposited film became 5000 Å.

A thick copper plated layer (thickness: 20 μm) was then formed on the vapor deposited layer of the aromatic polyimide film having the above-mentioned copper vapor deposited layer to prepare a metallized polyimide film.

The above-mentioned copper plating was conducted under the conditions of a plating bath composition comprising 90 g/liter of copper sulfate, 200 g/liter or sulfuric acid, and a small amount of luster agent (manufactured by EBARA-UDYLITE CO., LTD., trade name:

cathode current density of 4 A/dm², an anode/cathode area ratio of 1:1, and a voltage of 5 V.

According to the measurement standard, "Method 2.4.9 of IPC-TM-650", the peel strength (T-type peeling) of the copper vapor-deposited layer of the polyimide film having only the copper vapor deposited layer formed thereon and prepared as described above, and the peel strength (90° peeling) of the copper-plated layer of the metallized polyimide film having the copper vapor deposited layer and the copper-plated layer formed thereon, were respectively measured. The results are shown in Table 1.

EXAMPLE 2

An aromatic polyimide film with a thickness of 50 μm (i.e., polyimide film treated with a heat-resistant treating agent) was prepared in the same manner as in Example 1, and a metallized polyimide film was prepared, except that the above-prepared aromatic polyimide film was used.

Comparative Example 1

An aromatic polyimide film having a thickness of 25 μm (without surface treatment) was prepared, without a coating of the surface treating solution containing the heat-resistant surface treating agent on the surface of the solidified film obtained in Example 1. A metallized polyimide film was prepared in the same manner as in Example 1, except that the above-prepared aromatic polyimide film was used.

Comparative Example 2

An aromatic polyimide film with a thickness of 50 μm (without surface treatment) was prepared, without a coating of the surface treating solution containing a heat-resistant surface treating agent on the surface of the solidified film obtained in Example 1. A metallized polyimide film was prepared in the same manner as in Example 1, except that the above-prepared aromatic polyimide film was used.

TABLE 1

| No. | Peel strength (kg/cm) | |
| --- | --- | --- |
| | Copper vapor-deposited film (before copper plating) | Copper-plated layer |
| Example 1 | 0.35 | 1.5 |
| Example 2 | 0.30 | 1.0 |
| Comparative Example 1 | 0.20 | 0.6 |
| Comparative Example 2 | 0.15 | 0.5 |

EXAMPLE 3

On one surface (back side) of an aromatic polyimide film having a thickness of 25 μm obtained by film fabrication using an aromatic polyamic acid solution obtained from polymerization of equal moles of 3,3',4,4'-biphenyltetracarboxylic acid dianhydride and p-phenylenediamine, magnesium oxide (MgO) was vapor deposited by the vacuum vapor-deposition method using an electron beam heating means, under the conditions shown below, to directly form the vapor deposited layer of MgO (thickness: 2000 Å) on the entire surface thereof.

On the other surface (front side) of the above-mentioned aromatic polyimide film having the vapor deposited layer of MgO formed on the above-mentioned back side was directly formed a vapor deposited layer of copper (thickness: 5000 Å) by the vacuum vapor deposition method using the above-mentioned high frequency induction heating means, on the entire surface thereof.

As the conditions for the vacuum vapor deposition method mentioned above, the vacuum degree was about $10^{-4}$ to $10^{-3}$ Torr, the vapor deposition speed was 200 Å/sec., and further, the vapor deposited film thickness was 5000 Å.

Finally, on the copper vapor deposited layer of the above-mentioned aromatic polyimide film with the vapor-deposited layer of copper provided on the front side, was formed a thick copper plated layer (thickness: 20 μm) by electrical copper plating, under the conditions shown below, to prepare a metallized film.

As the above-mentioned conditions of the electrical copper plating method, the bath composition comprised 250 g/liter of copper sulfate, 60 g/liter of sulfuric acid and a small amount of a luster agent, and as the plating conditions, the temperature was 250° C., the cathode current density was 4 A/dm², the anode/cathode area ratio was 1:1, and the voltage was 5 V, and the plating was conducted while performing an air stirring and a constant filtration.

According to the measurement standard of, "Method 2.4.9 of IPC-TM-650", the peel strength (T-type peeling) of the copper deposited layer in the aromatic polyimide film (the film before copper plating) provided with the copper vapor-deposited layer formed in Example 1 as described above, and the peel strength (90° peeling) of the copper plated layer in the metallized film of the final product prepared in Example 3 as described above, were measured respectively. The results are shown in Table 2.

EXAMPLE 4

A metallized film was formed in the same manner as in Example 3, except that a vapor deposited film (thickness: 500 A) of SiO₂ was directly formed by a vapor deposition of silicon oxide (SiO₂) on the entire surface.

For the aromatic polyimide film provided only with the copper vapor deposited layer (the film before copper plating), and the metallized film, the peel strength of the copper vapor deposited layer or the copper plated layer was respectively measured by the same method as in Example 3. The results are shown in Table 2.

EXAMPLE 5

A metallized film was formed in the same manner as in Example 4, except that two copper vapor deposited layers (0.6 μm) were formed by twice forming the copper vapor deposited layer by the vacuum vapor deposition method.

For the aromatic polyimide film provided with only the copper vapor deposited layer (the film before copper plating), and the metallized film, the peel strength of the copper vapor deposited layer or the copper plated layer was respectively measured by the same method as in Example 3. The results are shown in Table 2.

Comparative Example 3

A vapor deposited layer of copper (thickness: 5000 Å) was formed directly on the other surface (front side) of the above-mentioned film in the same manner as in Example 1, without forming the vapor deposited layer of MgO on one surface (back side) of the aromatic polyimide film used in Example 3, followed by a formation of a thick copper plated layer (thickness: 20 μm) to prepare a metallized film.

For the aromatic polyimide film provided with only the copper vapor deposited layer (the film before copper plating), and the metallized film, the peel strength of the copper vapor deposited layer or the copper plated layer was respectively measured by the same method as in Example 3. The results are shown in Table 2.

Comparative Example 4

Without forming the vapor deposited layer of SiO₂ on one surface (back side) of the aromatic polyimide film used in Example 5, the formation of the vapor deposited layer (thickness: 6000 ) of copper was performed twice on the other surface (front side) of the above-mentioned film, followed by a formation of a thick copper layer (thickness: 20 μm) to prepare a metallized film.

For the aromatic polyimide film provided with only the copper vapor deposited layer (the film before copper plating), and the metallized film, the peel strength of the copper vapor deposited layer or the copper plated layer was respectively measured by the same method as in Example 3. The results are shown in Table 2.

EXAMPLE 6

An aromatic polyimide film was prepared by using a polyamic acid solution obtained by polymerization using approximately equal moles of 3,3',4,4'-biphenyltetracarboxylic acid dianhydride and pyromellitic acid dianhydride (mole ratio is 5:5), together with p-phenylenediamine and 4,4'-diaminodiphenyl ether (mole ratio is 7:3) as the dope for film fabrication.

A metallized film was formed in the same manner as in Example 4, except that the aromatic polyimide film as described above was used.

The peel strength of the metallized film was measured in the same manner as in Example 3. The results are shown in Table 2.

TABLE 2

| No. | Peel strength (kg/cm) | |
| --- | --- | --- |
| | Film before copper plating (copper-deposited layer) | Metallized film (copper-plated layer) |
| Example 3 | 0.40 | 1.70 |
| Example 4 | 0.35 | 1.55 |
| Example 5 | 0.30 | 1.15 |
| Comparative Example 3 | 0.20 | 0.50 |
| Comparative Example 4 | 0.16 | 0.20 |
| Example 6 | 0.50 | 2.00 |

We claim:

1. A process for preparing a metallized polyimide film, comprising the steps of:
    forming a solidified film containing 100 parts by weight of an aromatic polyamic acid in the form of a solution obtained by polymerizing approximately equal moles of an aromatic tetracarboxylic acid component and an aromatic diamine component and 5 to 150 parts by weight of an organic polar solvent;
    applying a surface treatment solution containing a heat-resistant surface treating agent to the surface of the solidified film;
    heating said solidified film to a high temperature to imidize the polyamic acid, while drying said film to prepare a polyimide film;
    forming a thin metal vapor deposited layer by a vapor deposition of a metal on the surface of the polyimide film treated with the heat-resistant surface treatment agent; and
    applying a metal plating onto the metal vapor deposited layer to form a metal plated layer thereon.

2. A process as claimed in claim 1, wherein said aromatic tetracarboxylic acid component contains 60 mole % or more of at least one component selected from the group consisting of biphenyltetracarboxylic acids, acid anhydrides thereof, and esterified products thereof with lower alcohols.

3. A process as claimed in claim 1, wherein said aromatic diamine component contains 60 mole % or more of p-phenylenediamine.

4. A process as claimed in claim 1, wherein said aromatic polyamic acid has a logarithmic viscosity of 0.1 to 7 determined at 30° C. and at a concentration of 0.5 g/100 ml N-methyl-2-pyrrolidone.

5. A process as claimed in claim 1, wherein the imidization degree is 85% or less, as determined by an infrared spectral analytical method.

6. A process as claimed in claim 1, wherein said organic polar solvent is an organic polar solvent capable of uniformly dissolving 2% to 50% by weight of the aromatic polyamic acid therein.

7. A process as claimed in claim 1, wherein said surface treating agent is at least one agent selected from the group consisting of heat-resistant aminosilane type, epoxysilane type and titanate type surface treating agents having a decomposition temperature of 275° C. or more.

8. A process as claimed in claim 1, wherein said metal is at least one member selected from the group consisting of noble metals, alkaline earth metals and transition metals and oxides thereof.

9. A process as claimed in claim 1, wherein said metal plated layer is composed of at least one member selected from the group consisting of copper, nickel, chromium, zinc, cadmium, tin, lead, gold, silver, cobalt, antimony, bismuth and arsenic.

10. A metallized polyimide film obtained by the process of claim 1, wherein the thicknesses of the polyimide film, the thin metal vapor deposited film, and the metal plated layer are 5 to 200 μm, 50 to 50,000 Å, and 1 to 100 μm, respectively.

11. A process for preparing a metallized polyimide film, comprising the steps of:
    forming a coating layer or a vapor deposited layer of an inorganic substance on one surface of an aromatic polyimide film;
    directly vapor-depositing a metal on the other surface of said film to form a thin metal deposited layer; and
    applying a metal plating onto the metal vapor deposited layer to form a metal plated layer.

12. A process as claimed in claim 11, wherein said aromatic polyimide film is obtained by polymerization and imidization of an aromatic tetracarboxylic acid component and an aromatic diamine component.

13. A process as claimed in claim 12, wherein said aromatic tetracarboxylic acid component contains 60 mole % or more of at least one component selected from the group consisting of biphenyltetracarboxylic acids, acid anhydrides thereof, and esterified products thereof with lower alcohols.

14. A process as claimed in claim 12, wherein said aromatic diamine component contains 60 mole % or more of p-phenylenediamine.

15. A process as claimed in claim 11, wherein said metal is at least one member selected from the group consisting of noble metals, alkaline earth metals and transition metals and oxides thereof.

16. A process as claimed in claim 11, wherein said metal plated layer is composed of at least one member selected from the group consisting of copper, nickel, chromium, zinc, cadmium, tin, lead, gold, silver, cobalt, antimony, bismuth and arsenic.

17. A metallized polyimide film obtained by the process of claim 11, wherein the thicknesses of the polyimide film, the thin metal vapor deposited film, and the metal plated layer are 5 to 200 μm, 50 to 50,000 Å, and 1 to 100 μm, respectively.

* * * * *